United States Patent [19]
Ishii et al.

[11] Patent Number: 5,841,302
[45] Date of Patent: Nov. 24, 1998

[54] SEMICONDUCTOR INTEGRATED CIRCUIT FOR USE AS A TWO-MODULUS PRESCALER

[75] Inventors: Noriko Ishii; Kenji Fujita, both of Tokyo, Japan

[73] Assignee: NEC Corporation, Tokyo, Japan

[21] Appl. No.: 855,613

[22] Filed: May 13, 1997

[30] Foreign Application Priority Data

May 13, 1996 [JP] Japan .................................. 8-118078

[51] Int. Cl.$^6$ .................................................. H03B 19/00
[52] U.S. Cl. ............................................. 327/117; 377/48
[58] Field of Search .................................. 327/113, 114, 327/115, 117, 199, 200, 202, 203, 208, 215, 218, 219; 377/47, 48

[56] References Cited

U.S. PATENT DOCUMENTS

| | | | |
|---|---|---|---|
| 4,745,302 | 5/1988 | Hanawa et al. ........................ | 327/218 |
| 5,091,699 | 2/1992 | Erickson et al. ....................... | 327/117 |
| 5,347,558 | 9/1994 | Nikjou .................................... | 327/117 |
| 5,469,116 | 11/1995 | Slemmer ................................ | 327/117 |
| 5,552,732 | 9/1996 | Huang .................................... | 327/218 |

FOREIGN PATENT DOCUMENTS 61-62232  3/1986  Japan .

*Primary Examiner*—My-Trang Nu Ton
*Attorney, Agent, or Firm*—Foley & Lardner

[57] ABSTRACT

A semiconductor integrated circuit suited for a two-modulus prescaler having a frequency dividing function $5 \times 2^n / 5 \times 2^n + 1$ (n=0 or an integer of 1 or more) for use in high speed frequency dividing operation. Frequency dividing ratios are changed using a modulus control signal MC by a control circuit which is constituted by a level shift circuit or another slave circuit connected in parallel with a conventional slave circuit so as to remove a NOR conventionally required.

8 Claims, 6 Drawing Sheets

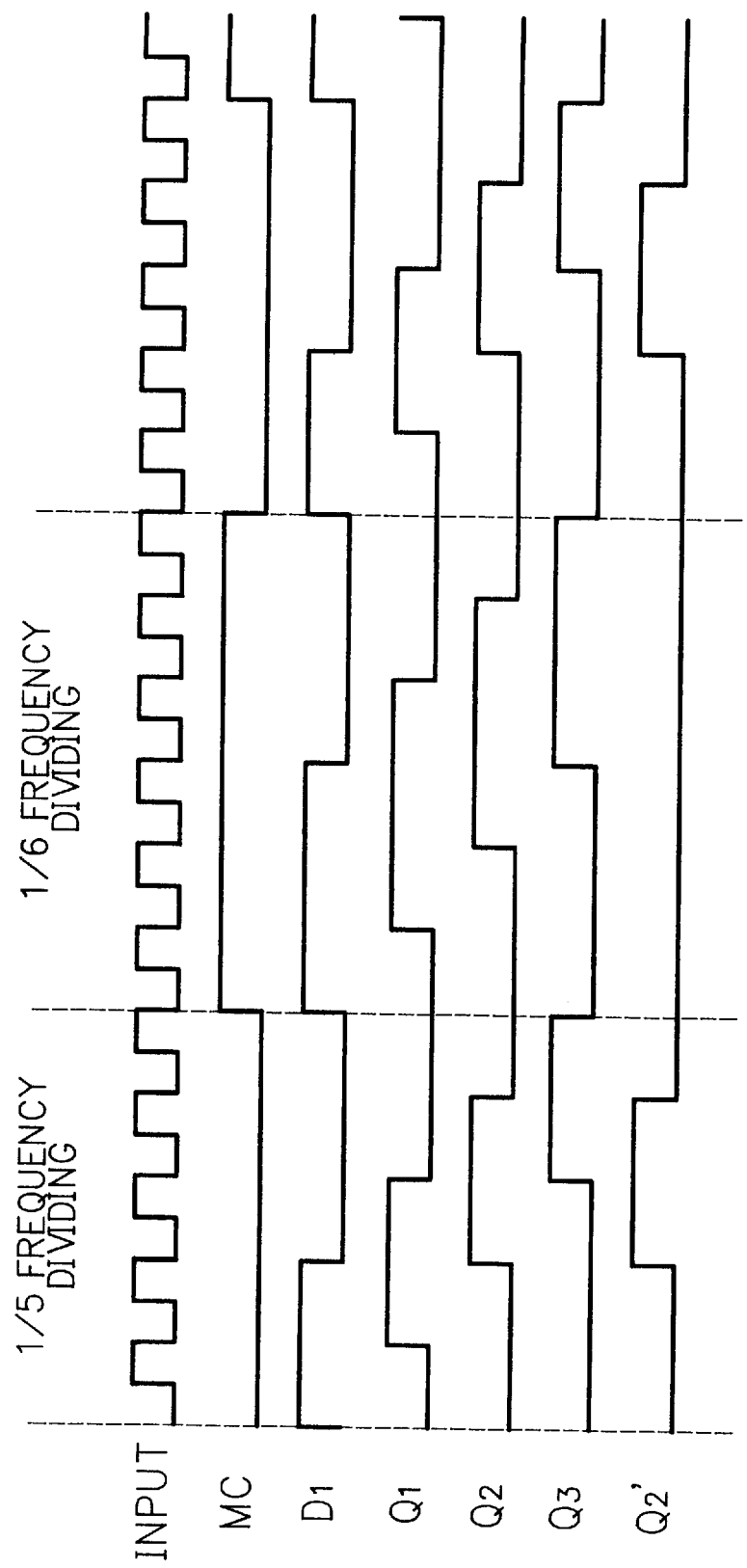

SEMICONDUCTOR INTEGRATED CIRCUIT FOR USE AS A TWO-MODULUS PRESCALER

BACKGROUND OF THE INVENTION

The present invention relates to a semiconductor integrated circuit suited for a two-modulus prescaler used in high frequency.

DESCRIPTION OF THE RELATED ART

A conventional two-modulus prescaler having two frequency dividing ratios is used for attaining high speed frequency dividing operations and reducing consumption current in a frequency synthesizer or the like of a radio receiver, as disclosed in Japanese Patent Laid-Open Publication No. 61-62232. FIG. 1 shows a conventional two-modulus prescaler having a frequency dividing function $4\times2^n/4\times2^n+1$ (n=0 or an integer of 1 or more; 4/5, 8/9, ...). As shown in FIG. 1, the two-modulus prescaler comprises three master-slave D flip-flops (hereinafter "DFFs") 201, 202 and 203, two T flip-flops (hereinafter "TFFs") 204 and 205, two NOR gates (hereinafter "NORs") 206 and 207, and an OR gate (hereinafter "OR") 208. A signal to be divided is input to clock terminals CLs of the DFFs 201 to 203 and a divided signal is output from an output terminal Q of the TFF 205. This two-modulus prescaler operates as a frequency divider of 1/16 or 1/17. The frequency dividing ratios can be changed by switching the levels High/Low of a modulus control signal MC to be fed to the OR 208. Three DFFs 201 to 203 act as a frequency divider of 1/4 or 1/5 depending on the level of the modulus control signal MC.

FIG. 2A shows two NORs 206 and 207 and a master part 201M of the DFF 201 in the two-modulus prescaler (an equivalent circuit of FIG. 2B). In FIGS. 2A and 2B, a broken line circuit corresponding to the NORs 206 and 207 directly contacts a constant current source of the master part 201M of the DFF 201 and is built in the DFF 201.

In FIG. 2A, FET T101/T101a, T102/T102a and T103/T103a, whose sources are coupled in common, are connected stepwise and constitute load transistors of a driver transistor T104 linked to a signal input terminal 101. The sources coupled in common of FET T104/T104a is connected to a constant current source 111 via FET Tg for the constant current source. The drains of FET T101/T101a are connected to respective ends 108 and 108a of resistors R101 and R102.

In the circuit shown in FIG. 2A, signals to be input to terminals 104, 105 and 106 have inverting phases of those input to terminals 104a, 105a and 106a, and the circuit operates so that FET T102a is OFF when FET T101 is ON.

FIG. 3 shows another conventional two-modulus prescaler having a frequency dividing function $5\times2^n/5\times2^n+1$ (n=0 or an integer of 1 or more; 5/6, 10/11, 20/21, ...). In FIG. 3, the two-modulus prescaler is constituted by a DFF 301 including a NOR as a composite circuit of the DFF, two DFFs 302 and 303, and a NOR 304. A signal to be divided is input to the clock terminals CLs of the DFFs 301 to 303, and, while controlling the change of the frequency dividing ratios using the modulus control signal MC fed to one input terminal of the NOR 304, a divided signal having a frequency dividing ratio 1/5 or 1/6 is output from an output terminal Q of the DFF 303. A negative logic output Qof the DFF 302 is fed back to another input terminal of the NOR 304, and a positive logic output Q is fed back to one input terminal of the NOR within the DFF 301. The DFF of the DFF 301 including the NOR, and the DFFs 302 and 303 are the master-slave D flip-flops and are coupled in series.

In FIG. 3, when the modulus control signal MC is high, the output of the NOR 304 is always low to carry out the 1/6 frequency dividing. In this case, the maximum operational frequency $f_{max}$ of the two-modulus prescaler is obtained as follows:

$$f_{max}=1/(2\ T_{pd}(DFF)) \quad (1)$$

In this formula, $T_{pd}(DFF)$ represents the operation time of one DFF used as the master or the slave in the DFF 301 including the NOR and the DFFs 302 and 303. In this case, each DFF is operated by the same clock signal and the operation time of each DFF in the whole circuit is the sum of the time of the master part and the slave part. This total time does not include the delay of the operation time of the NOR 304 to output a constant value.

On the other hand, when the modulus control signal MC is low, the NOR 304 operates as an inverter and an inverted pulse string is output from the negative logic output Qof the DFF 302, thereby performing a 1/5 frequency dividing. In this case, different from a 1/6 frequency dividing, the entire operation time includes the operation time $T_{pd}(NOR)$ of the NOR 304 and the maximum operational frequency $f_{max}$ of the two-modulus prescaler is obtained as follows:

$$f_{max}=1/(2\ T_{pd}(DFF)+T_{pd}(NOR)) \quad (2)$$

As described above, in the two-modulus prescaler having the frequency dividing function $5\times2^n/5\times2_n+1$ (n =0 or an integer of 1 or more), the maximum operational frequency $f_{max}$ is different depending on the frequency dividing ratio. When the NOR 304 operates as the inverter in the 1/5 frequency dividing, the circuit operation is delayed by the operation time of the NOR 304, and the high speed frequency dividing obtained in the 1/6 frequency dividing cannot be attained.

SUMMARY OF THE INVENTION

It is therefore an object of the present invention to provide a semiconductor integrated circuit in view of the aforementioned disadvantages of the prior art, which is capable of operating a high speed frequency dividing in a two-modulus prescaler having a frequency dividing function $5\times2^n/5\times2^n+1$ (n=0 or an integer of 1 or more).

In accordance with one aspect of the present invention, there is provided a semiconductor integrated circuit, comprising a frequency divider for carrying out a frequency dividing either $1/(5\times2^n)$ or $1/(5\times2^n+1)$ (n=0 or an integer of 1 or more) of an input signal according to a switch signal; and a controller for changing operation states of the frequency divider by the switch signal, the controller being constituted by a level shifter.

In a semiconductor integrated circuit, the controller preferably includes a constant current source, a switching circuit connected in parallel with the constant current source, and a load circuit of the switching circuit.

In accordance with another aspect of the present invention, there is provided a semiconductor integrated circuit, comprising a frequency divider for carrying out a frequency dividing either $1/(5\times2^n)$ or $1/(5\times2^n+1)$(n=0 or an integer of 1 or more) of an input signal according to a switch signal; and a controller for changing operation states of the frequency divider by the switch signal, the frequency divider being constituted by a D flip-flop circuit, the controller being constituted by two slave circuits within the D flip-flop circuit, an operation state of one of the two slave circuits being changed by the switch signal to change frequency dividing ratios.

In this semiconductor integrated circuit, a NOR circuit (NOR 304) is replaced with a controller having no delay, resulting in attaining a high speed frequency dividing operation which is expressed by the maximum operational frequency $f_{max}$ of the two-modulus prescaler is obtained as follows:

$$f_{max}=1/(2T_{pd}(\text{DFF})) \qquad (1)$$

BRIEF DESCRIPTION OF THE DRAWINGS

The objects, features and advantages of the present invention will become more apparent from the consideration of the following detailed description, taken in conjunction with the accompanying drawings, in which:

FIG. 7 is a timing chart showing an operation of the semiconductor integrated circuit shown in FIG. 6.

DESCRIPTION OF THE PREFERRED EMBODIMENTS

Figure 4:
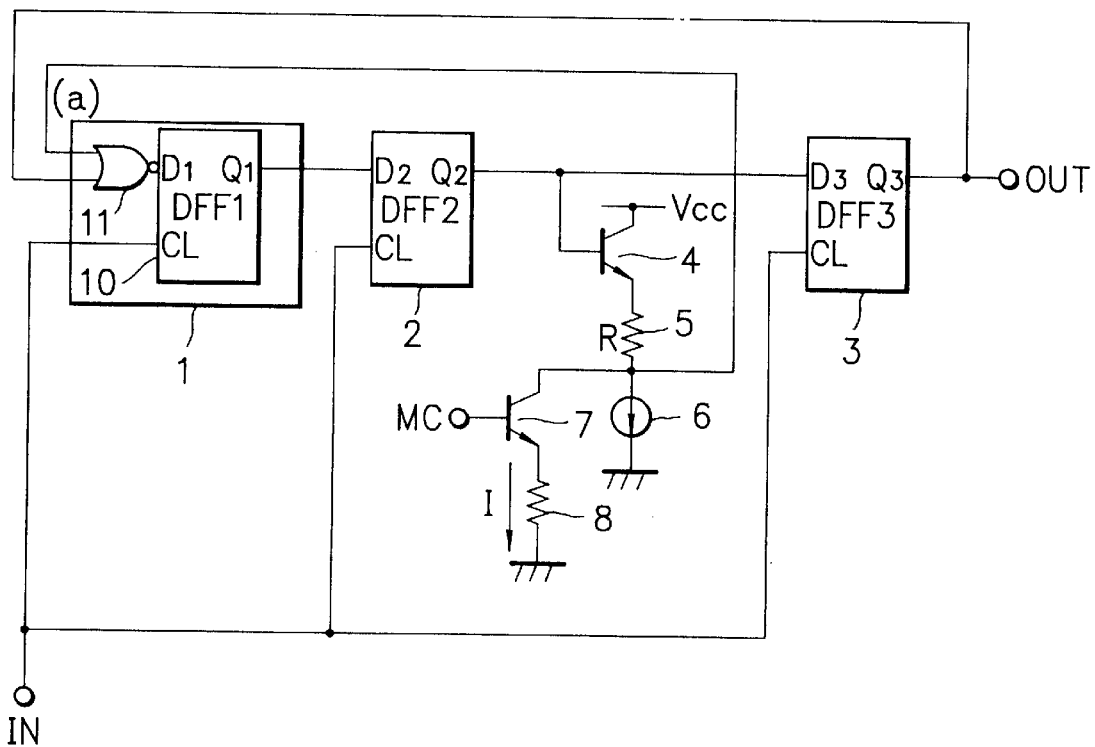
FIG. 4 is a block diagram showing a semiconductor integrated circuit suited for a two-modulus prescaler having a frequency dividing function $5 \times 2^n / 5 \times 2^n + 1$ (n=0 or an integer of 1 or more) according to a first embodiment of the present invention.

Referring now to the drawings, there is shown in FIG. 4 a semiconductor integrated circuit suited for a two-modulus prescaler having a frequency dividing function $5 \times 2^n / 5 \times 2^n + 1$ (n=0 or an integer of 1 or more; in this case, n=0) according to a first embodiment of the present invention.

In this embodiment, the two-modulus prescaler comprises three cascaded DFFs (D flip-flops), that is, a DFF 1 composed of a DFF 10 and a NOR 11, and two DFFs 2 and 3, an emitter follower circuit, connected to an output terminal $Q_2$ of the DFF 2, including a transistor 4 and a resistor 5, a constant current source 6 coupled between the resistor 5 and a ground, and a combination of a transistor 7 and a resistor 8 connected in series, coupled in parallel with the constant current source 6 between the resistor 5 and the ground. A signal to be frequency-divided is input to clock terminals CLs of the three DFFs 10, 2 and 3 and each DFF is of a master-slave type.

An output terminal $Q_3$ of the DFF 3 is connected to one input terminal of the NOR 11 and the contact point between the resistor 5 and the constant current source 6 is connected to the other input terminal of the NOR 11 to send a feedback signal (a). The collector of the transistor 4 is coupled to a voltage source $V_{cc}$ and its base is connected to an output terminal $Q_2$ of the DFF 2. A modulus control signal MC for switching frequency dividing ratios is input to the base of the transistor 7. An output terminal $Q_1$ of the DFF 10 is connected to an input terminal $D_2$ of the DFF 2 and the output terminal $Q_2$ of the DFF 2 is connected to an input terminal $D_3$ of the DFF 3. A divided signal is output from the output terminal $Q_3$ of the DFF 3.

In the foregoing two-modulus prescaler, the frequency dividing ratios are changed by switching ON or OFF the transistor 7 coupled in parallel with the constant current source 6 using the modulus control signal MC.

Figure 5:
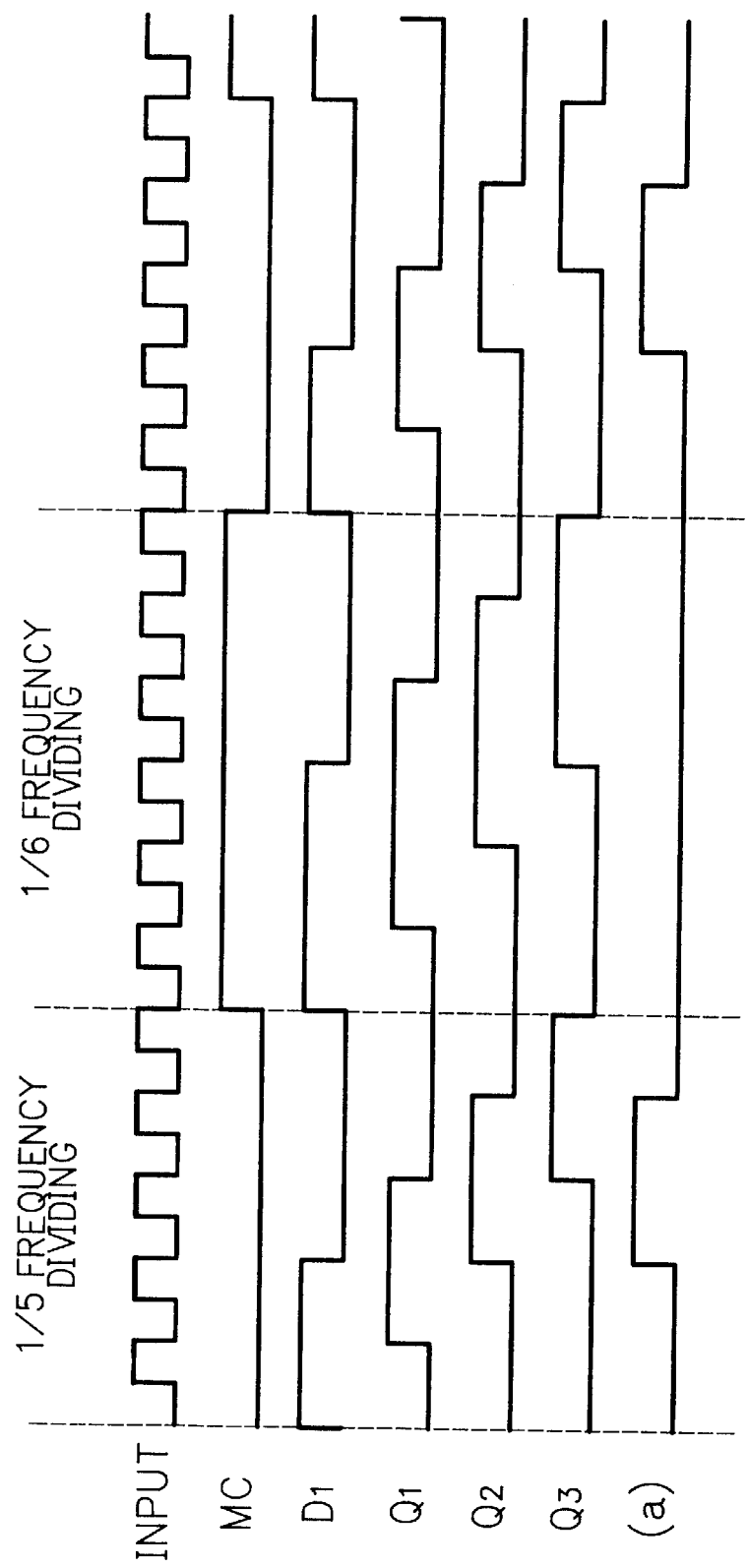
FIG. 5 is a timing chart showing an operation of the semiconductor integrated circuit shown in FIG. 4.

The operation of the two-modulus prescaler shown in FIG. 4 will be described in connection with FIG. 4 and FIG. 5. When the modulus control signal MC is high, a DC level of the feedback signal (a) is reduced to become lower than an input threshold level of the DFF 1 with the NOR (NOR 11). That is, a low level signal is input to one input terminal of the NOR 11 to allow the NOR 11 to execute a switching operation as an inverter. Hence, the output signal of the DFF 3 is inverted in the NOR 11 and as a result, a ⅙ frequency dividing operation is carried out, as shown in a timing chart shown in FIG. 5.

In the case that the modulus control signal MC is high, assuming that a resistance value of the resistor 5 is R and a current value flowing in the transistor 7 in the conducting state is I, a voltage drop amount $\Delta V$ (a difference between potentials when the modulus control signal MC is high and low) of the feedback signal (a) is expressed by $\Delta V = R \times I$.

On the other hand, when the modulus control signal MC is low, the feedback signal (a) becomes equal to the output signal $Q_2$ of the DFF 2. In other words, two feedback signals are switched by the NOR 11, resulting in a ⅕ frequency dividing operation, as shown in FIG. 5. In this case, there is no inverter circuit, and the emitter follower circuit is connected to the output of the DFF 2 in an inverted phase ($Q_2 \rightarrow \overline{Q_2}$) of the conventional example.

In this embodiment, as described above, one NOR is replaced with a level shift circuit to eliminate the operation time difference between the ⅕ and ⅙ frequency dividings. Further, the operation delay time produced by the NOR can be removed with the result of a quicker operation compared with the conventional prescaler.

Figure 6A:
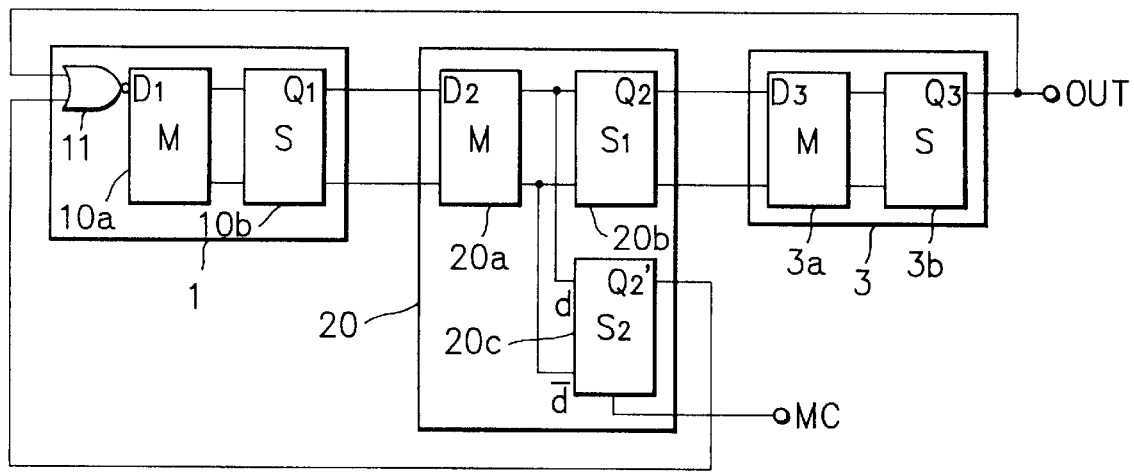
FIG. 6A is a block diagram showing a semiconductor integrated circuit suited for a two-modulus prescaler according to a second embodiment of the present invention and FIG. 6B is a circuit diagram of a DFF 20 shown in FIG. 6A.

FIG. 6A shows a semiconductor integrated circuit suited for a two-modulus prescaler having a frequency dividing function $5 \times 2^n / 5 \times 2^n + 1$ (n=0 or an integer of 1 or more) according to a second embodiment of the present invention.

Figure 6B:
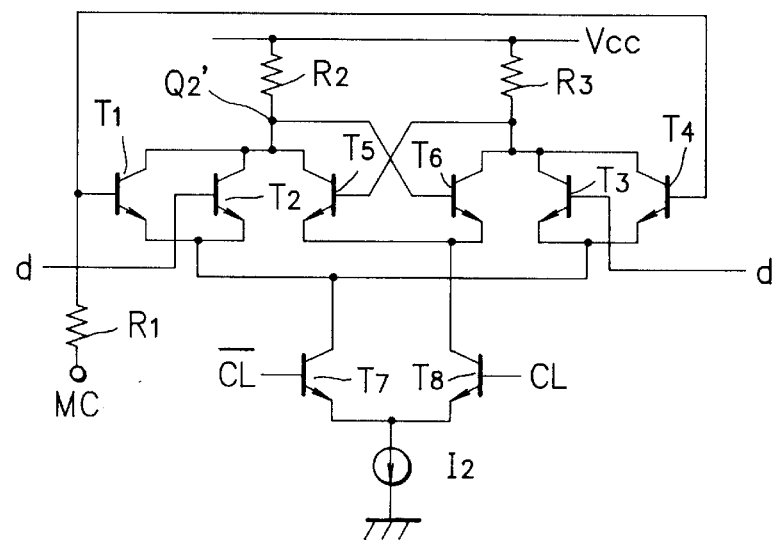

In this embodiment, the two-modulus prescaler has a similar construction to that of the first embodiment shown in FIG. 4, except that a second stage DFF 20 including one master part (M) 20a and two slave parts ($S_1$ and $S_2$) 20b and 20c coupled in parallel to the output of the master part 20a is provided instead of the DFF2, the emitter follower circuit including the transistor 4 and the resistor 5, the constant current source 6, the transistor 7, and the resistor 8 in the first embodiment. FIG. 6B is a circuit diagram of the DFF 20 shown in FIG. 6A. In this embodiment, the DFF 1 and the DFF 3 are shown in their divided master and slave parts M and S. That is, the first stage DFF 1 includes a DFF composed of a master part (M) 10a and a slave part (S) 10b and a NOR 11, and a third stage DFF 3 includes a master part (M) 3a and a slave part (S) 3b. Further, an input signal to be input to clock terminals of the DFFs is omitted for brevity.

In the two-modulus prescaler shown in FIG. 6A, positive and negative outputs of the first stage DFF 1 with a NOR are input to positive and negative input terminals of the second stage DFF 20. In the DFF 20, an output $Q_2$ of the first slave part 20b is input to an input terminal $D_3$ of the third stage DFF 3. The second slave part 20c is switched by a modulus control signal MC and its output $Q_2'$ is input to one input terminal of the NOR 11 of the DFF 1. An output $Q_3$ of the third stage DFF 3 is fed back to the other input terminal of the NOR 11.

In the second slave part 20c, as shown in FIG. 6B, collectors and emitters are connected in common in transistors $T_1$ and $T_2$ and transistors $T_3$ and $T_4$, respectively, and bases of the transistors $T_1$ and $T_4$ are set by changing high/low levels of the modulus control signal MC input via a resistor $R_1$. The output $Q_2'$ is taken out from one end of a resistor $R_2$ connected to the collectors of the transistors $T_1$ and $T_2$. In FIG. 6B, $T_5$ to $T_8$ represent transistors, $R_3$ represents a resistor, $I_2$ represents a constant current source, and CL and CLcorrespond to a CL terminal and an inverted input terminal, respectively.

In this embodiment, when the modulus control signal MC is high ($T_1$, $T_2$ and $T_4$ are ON), a DC level of the feedback signal $Q_2'$ drops lower than an input threshold level of the DFF 1 with the NOR. Hence, the output signal $Q_3$ of the DFF 3 is inverted in the NOR 11 of the DFF 1, resulting in operating a ⅙ frequency dividing, as shown in FIG. 7.

On the other hand, when the modulus control signal MC is low, the feedback signal $Q_2'$ becomes equal to the output signal $Q_2$ of the first slave part 20b. That is, the two input feedback signals switch in the NOR 11 of the DFF 1 to operate for a ⅕ frequency dividing, as shown in FIG. 7.

In this embodiment, as described above, one NOR of the conventional prescaler is replaced with two slave parts in one DFF so as to switch its state. Hence, similar to the first embodiment described above, a quicker operation of the circuit can be accomplished.

Figure 1:
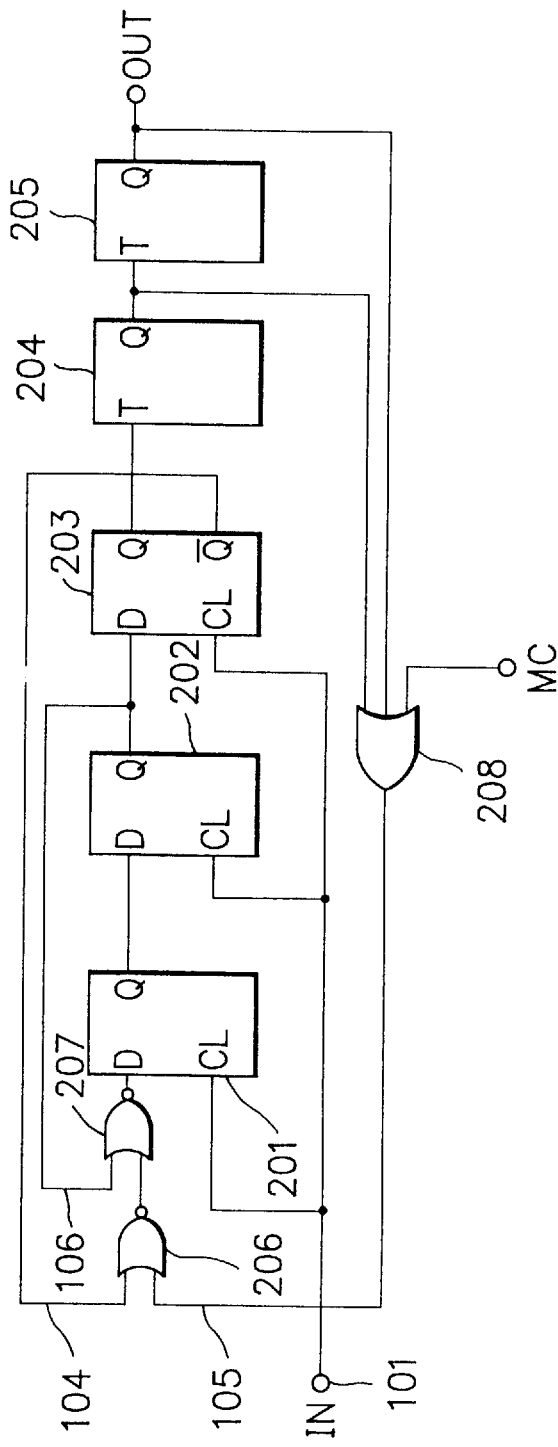
FIG. 1 is a block diagram showing a conventional two-modulus prescaler having a frequency dividing function $4 \times 2^n / 4 \times 2^n + 1$.
Figure 2A:
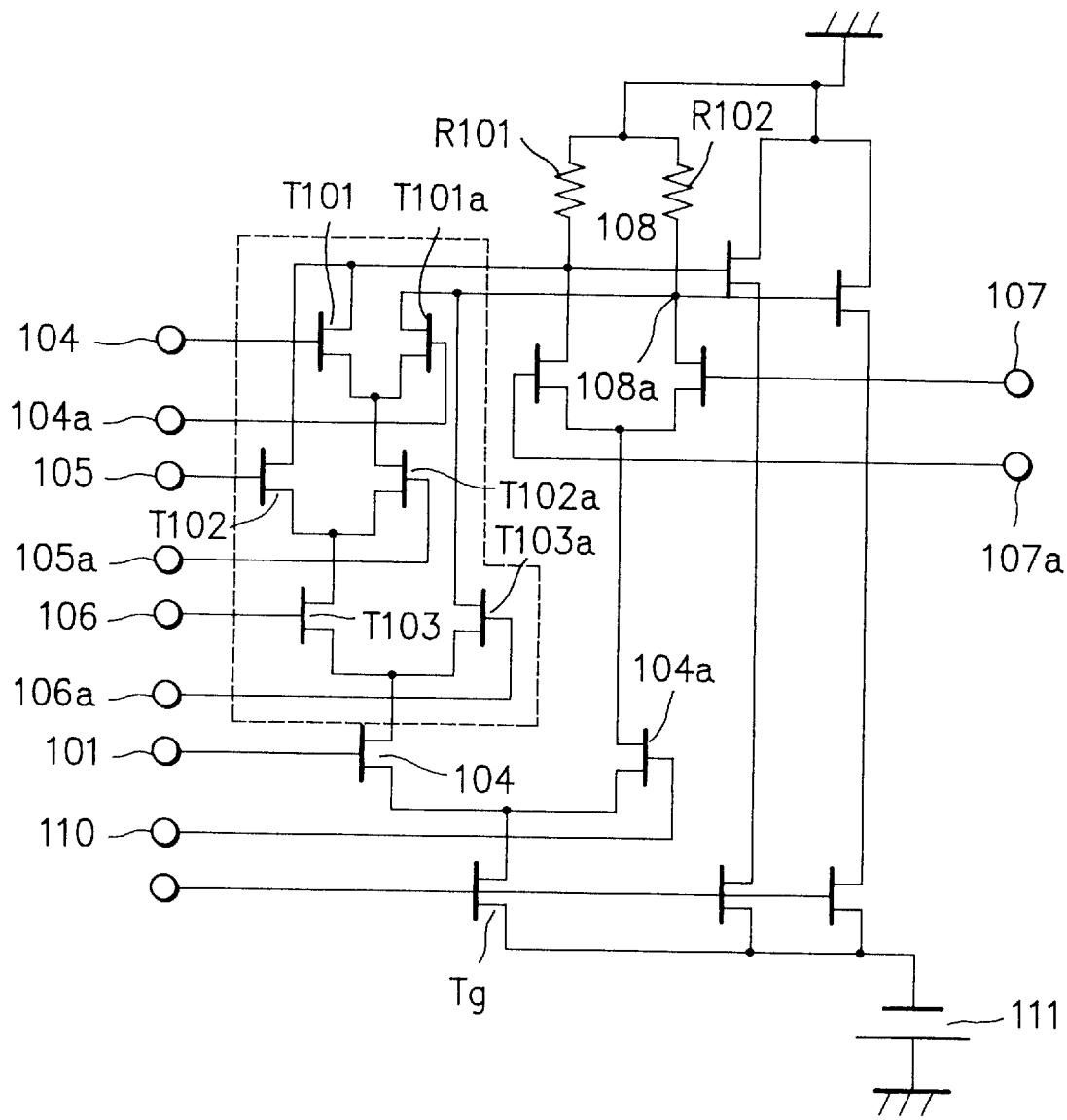
FIG. 2A is a circuit diagram showing a circuit structure of a combination of a DFF 201 and NORs 206 and 207 shown in FIG. 1, which is an equivalent circuit of FIG. 2B.
Figure 2B:
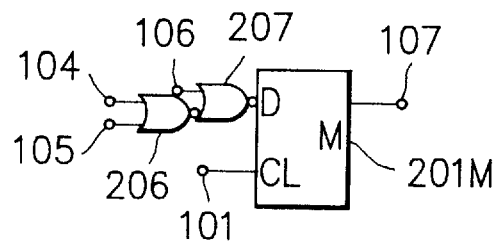
Figure 3:
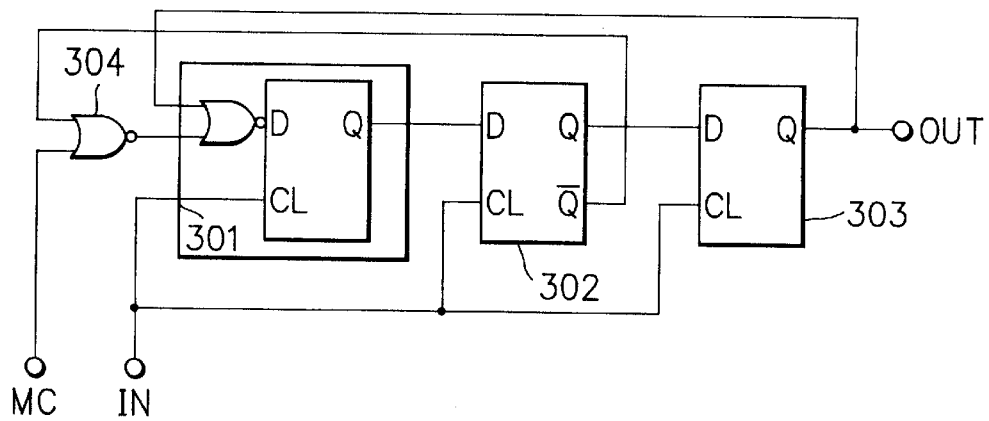
FIG. 3 is a block diagram showing a conventional two-modulus prescaler having a frequency dividing function $5 \times 2^n / 5 \times 2^n + 1$.

As described above, in the first embodiment, the maximum operational frequency turns out to be 1.4 times compared with the conventional circuit shown in FIG. 3. That's why the NOR 304 shown in FIG. 3 is replaced with a level shift circuit. Further, in the second embodiment, the maximum operational frequency becomes 1.4 times that of conventional circuit shown in FIG. 3. The reason is that the second slave part 20c is provided instead of a circuit corresponding to the NOR 304 shown in FIG. 3.

As described above, according to the present invention, in a semiconductor integrated circuit suited for a two-modulus prescaler having a frequency dividing function 5× $2^n$/5× $2^n$+1 (n=0 or an integer of 1 or more), a control circuit for controlling to change frequency dividing ratios is constituted by a level shift circuit or another slave circuit connected in parallel with a conventional slave circuit so as to replace a NOR conventionally required. Hence, in the frequency diving of 5×$2^n$/5×$2^n$+1, an operation time difference due to the frequency dividing ratios can be removed, and as a result, a high speed frequency dividing operation can be attained with respect to both the frequency dividing ratios.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor integrated circuit, comprising:
   a frequency divider for selectively carrying out a frequency division with at least two frequency dividing ratios of an input signal according to a switch signal; and
   a controller for changing operation states of the frequency divider between said at least two frequency dividing ratios utilizing said switch signal, the controller comprising a level shifter,
   wherein said frequency divider comprises:
      a first flip flop (FF) having a clock input for receiving the input signal to be divided and an output for providing an output signal, said first FF receiving a signal from a NOR gate having first and second inputs,
      a second FF having an input connected to receive the output from said first FF and an output for providing an output signal,
      said level shifter having an input connected to receive the output from said second FF and an output for providing signal, said level shifter having a control input connected to receive said switch signal,
      a third FF having an input connected to receive the output from said second FF and an output for providing an output signal which is the desired divided signal,
      said first FF connected to receive said divided signal through said first input of said NOR gate and said output from said level shifter through said second input of said Nor gate.

2. A semiconductor integrated circuit as claimed in claim 1, wherein the level shifter includes a constant current source, a switching circuit connected in parallel with the constant current source, and a load circuit connected in series with the switching circuit.

3. A circuit as recited in claim 1 wherein said first, second and third FFs are D-type FFs, and said second and third DFFs each have a clock input connected to receive said clock signal.

4. A circuit as recited in claim 1 wherein the output signal of said level shifter takes on a first state in response to one condition of said switch signal causing said NOR gate to operate as an inverter and a second state in response to another condition of said switch signal, said second state being the same state as the output signal of said second FF.

5. A circuit as recited in claim 1 wherein said at least two dividing ratios are selected among groups 1/(5×$2^n$) or 1/(5× $2^n$+1), where n is an integer greater than or equal to zero.

6. A semiconductor integrated circuit, comprising:
   a frequency divider for selectively carrying out a frequency division with at least two frequency dividing ratios of an input signal according to a switch signal,
   wherein the frequency divider comprises:
      a first DFF connected to a first slave circuit,
      a second DFF Connected to said first slave circuit, and
      a third DFF connected to a second slave circuit; and
   a controller for changing operation states of the frequency divider utilizing said switch signal,
   wherein the controller comprises two slave circuits connected to said second DFF,
   an output of a first of said two slave circuits connected to an input of said third DFF and an output of a second of said two slave circuits connected to an input of said first DFF,
   said second of said two slave circuit connected to receive said switch signal and changing an output state thereof in response to a change in condition of said switch signal,
   an operation state of one of the two slave circuits being changed by said switch signal to change from one of said at least two frequency dividing ratios to another of said at least two dividing ratios.

7. A circuit as recited in claim 6 wherein said first DFF further includes a NOR gate connected at the input thereof, said NOR gate having a first input connected to receive said output of said second of said two slave circuits and a second input connected to receive an output of said third DFF.

8. A circuit as recited in claim 6 wherein said at least two dividing ratios are selected among groups 1/(5×$2^n$) or 1/(5× $2^n$+1), where n is an integer greater than or equal to zero.

* * * * *